(12) United States Patent
Hu et al.

(10) Patent No.: US 10,629,615 B1
(45) Date of Patent: Apr. 21, 2020

(54) SEMICONDUCTOR STRUCTURE HAVING DOPED ACTIVE PILLARS IN TRENCHES

(71) Applicant: MACRONIX INTERNATIONAL CO., LTD., Hsinchu (TW)

(72) Inventors: Chih-Wei Hu, Toufen Township (TW); Teng-Hao Yeh, Hsinchu County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/239,681

(22) Filed: Jan. 4, 2019

(51) Int. Cl.
*H01L 27/11582* (2017.01)
*H01L 21/28* (2006.01)
*H01L 21/324* (2006.01)
*H01L 21/265* (2006.01)

(52) U.S. Cl.
CPC .. *H01L 27/11582* (2013.01); *H01L 21/26513* (2013.01); *H01L 21/324* (2013.01); *H01L 29/40114* (2019.08); *H01L 29/40117* (2019.08)

(58) Field of Classification Search
None
See application file for complete search history.

(56) References Cited

U.S. PATENT DOCUMENTS

| 9,754,957 B2 | 9/2017 | Lee et al. | |
| 2008/0079046 A1* | 4/2008 | Ozaki | H01L 27/105 257/295 |
| 2008/0212366 A1* | 9/2008 | Ohsawa | G11C 11/404 365/182 |
| 2009/0206400 A1* | 8/2009 | Juengling | H01L 21/823431 257/331 |
| 2019/0341384 A1* | 11/2019 | Lilak | B82Y 40/00 |
| 2020/0006376 A1* | 1/2020 | Makala | H01L 27/11582 |

OTHER PUBLICATIONS

Office Action dated Jul. 3, 2019 in Taiwan application No. 10820627540, pp. 1-4.

* cited by examiner

*Primary Examiner* — Michael Jung
(74) *Attorney, Agent, or Firm* — McClure, Qualey & Rodack, LLP

(57) ABSTRACT

A semiconductor structure includes a plurality of stacks, a plurality of active pillars, and an insulating material. The stacks are separated from each other by a plurality of trenches. The active pillars are disposed in the trenches and separated from each other in each of the trenches. Each of the active pillars comprises two n-type heavily doped portions at two sides thereof. Each of the two n-type heavily doped portions extends in a substantially vertical direction. Each of the two n-type heavily doped portions connects corresponding two stacks of the plurality of stack. The insulating material is located in remaining spaces of the trenches between the active pillars. The insulating material is a silicon glass comprising an element which is applicable as a n-type dopant.

7 Claims, 15 Drawing Sheets

SEMICONDUCTOR STRUCTURE HAVING DOPED ACTIVE PILLARS IN TRENCHES

TECHNICAL FIELD

This disclosure relates to a semiconductor structure and a method for forming the same. More particularly, this disclosure relates to a semiconductor structure, which comprises a n-type heavily doped portion extending in a substantially vertical direction with a uniform doping concentration from top to bottom, and a method for manufacturing the same.

BACKGROUND

For reasons of decreasing volume, reducing weight, increasing power density, improving portability, and the like, three-dimensional (3D) semiconductor structures have been developed. Typically, stacks comprising a plurality of layers may be formed on the substrate, and separated from each other by high aspect ratio trenches. In some types of 3D semiconductor structures, doped portions extending in a vertical direction may be further arranged in the trenches. Such doped portions may be made by a formation process of vertically arranged polysilicon layers and a following (ion) implantation process. However, since the implantation process is typically conducted from the top of the whole structure and the portions are vertically arranged in the high aspect ratio trenches, it is difficult to obtain an uniform doping concentration in the vertical direction. Generally, a doping concentration near the top is higher than a doping concentration near the bottom. This condition may lead to electrical property differences between a device near the top and a device near the bottom.

SUMMARY

The disclosure is directed to a semiconductor structure and a method for forming the same. According to the disclosure, a n-type heavily doped portion extending in a substantially vertical direction with a uniform doping concentration from top to bottom can be provided in the semiconductor structure.

According to some embodiments, the semiconductor structure comprises a plurality of stacks, a plurality of active pillars, and an insulating material. The stacks are separated from each other by a plurality of trenches. The active pillars are disposed in the trenches and separated from each other in each of the trenches. Each of the active pillars comprises two n-type heavily doped portions at two sides of the each of the active pillars. Each of the two n-type heavily doped portions extends in a substantially vertical direction. Each of the two n-type heavily doped portions connects corresponding two stacks of the plurality of stacks. The insulating material is located in remaining spaces of the trenches between the active pillars. The insulating material is a silicon glass comprising an element which is applicable as a n-type dopant.

According to some embodiments, the method for forming such a semiconductor structure comprises following steps. First, an initial structure is provided. The initial structure comprises a plurality of stacks separated from each other by a plurality of trenches. A plurality of semi-manufactured active pillars are formed in the trenches. The semi-manufactured active pillars are separated from each other in each of the trenches. An insulating material is filled into remaining spaces of the trenches between the semi-manufactured active pillars. The insulating material is a silicon glass comprising an element which is applicable as a n-type dopant. Thereafter, n-type heavily doped portions are formed between the semi-manufactured active pillars and the insulating material by conducting a thermal process that drives the element which is applicable as a n-type dopant into the semi-manufactured active pillars.

Figure 1:
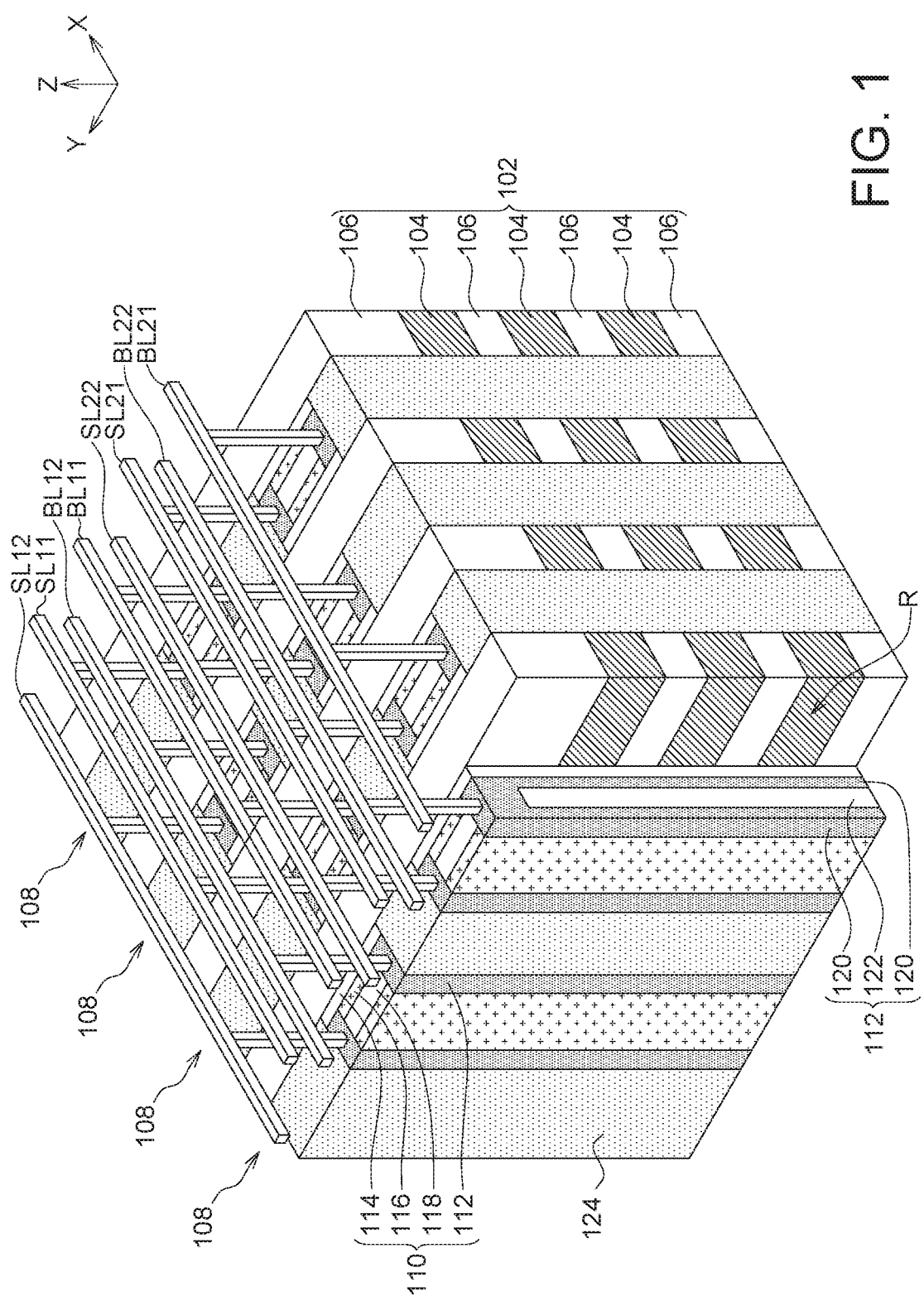
FIG. 1 shows an exemplary semiconductor structure according to embodiments.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated into another embodiment without further recitation.

A semiconductor structure according to embodiments comprises a plurality of stacks, a plurality of active pillars, and an insulating material. The stacks are separated from each other by a plurality of trenches. The active pillars are disposed in the trenches and separated from each other in each of the trenches. Each of the active pillars comprises two n-type heavily doped portions at two sides thereof. Each of the two n-type heavily doped portions extends in a substantially vertical direction. Each of the two n-type heavily doped portions connects corresponding two stacks of the plurality of stacks. The insulating material is located in remaining spaces of the trenches between the active pillars. The insulating material is a silicon glass comprising an element which is applicable as a n-type dopant.

An example of such a semiconductor structure is illustrated in FIG. 1. For clarity, the semiconductor structure is illustrated as a 3D AND flash memory device, and the insulating material in the region R is removed. However, it can be appreciated that embodiments of the disclosure is not limited thereto.

Referring to FIG. 1, the exemplary semiconductor structure 100 comprises a plurality of stacks 102. Each of the stacks 102 may comprise alternately stacked conductive stripes 104 and insulating stripes 106. The number of the conductive stripes 104 and the number of the insulating stripes 106 are not particularly limited. While not shown in FIG. 1, each of the stacks 102 may further comprise one or more other layers. The stacks 102 are separated from each other by a plurality of trenches 108.

The semiconductor structure 100 further comprises a plurality of active pillars 110. The active pillars 110 are disposed in the trenches 108 and separated from each other in each of the trenches 108. Each of the active pillars 110 comprises two n-type heavily doped portions 112 at two sides thereof. Each of the two n-type heavily doped portions 112 extends in a substantially vertical direction. Herein, a vertical direction indicates a direction perpendicular to a main surface of the semiconductor structure, such as the top surface of a substrate (not shown in FIG. 1) on which the stacks 102 are formed. In the drawings, the vertical direction is the Z-direction, and as shown in FIGS. 2A-15A, the top surface of the substrate extends in the X-Y plane. The term "substantially vertical direction" allows for some degrees of deviation from the exact vertical direction that is acceptable for the semiconductor devices. Such a deviation may, for example, be a result of the process limitation. Each of the two n-type heavily doped portions 112 connects corresponding two stacks 102 of the plurality of stacks 102. More specifically, in the X-Y plane, the n-type heavily doped portions 112 may extend in a direction perpendicular to an extending direction of the stacks 102.

As an AND flash memory device, in the semiconductor structure 100, each of the active pillars 110 may further comprise two memory layers 114, two channel layers 116, and an insulating layer 118. The two memory layers 114 disposed on sidewalls of the corresponding two stacks 102, respectively. The two channel layers 116 are disposed between the two memory layers 114. The two channel layers 116 are disposed on sidewalls of the two memory layers 114, respectively. The insulating layer 118 is disposed between the two channel layers 116. The two channel layers 116 and the insulating layer 118 are located between the two n-type heavily doped portions 112. While not shown in FIG. 1, each of the active pillars 110 may further comprise one or more other components. For example, each of the active pillars 110 may further comprise a contact plug disposed on the insulating layer 118. The contact plug is p-type implanted. Each of the active pillars 110 may further comprise a p-type doped region disposed under the insulating layer 118.

Correspondingly, each of the n-type heavily doped portions 112 may comprise two n-type heavily doped parts 120 and an insulating part 122. The two n-type heavily doped parts 120 are disposed close to the corresponding two stacks 102, respectively. The insulating part 122 is disposed between the two n-type heavily doped parts 120. More specifically, the locations of the two n-type heavily doped parts 120 correspond to the locations of the two channel layers 116, and the location of the insulating part 122 corresponds to the location of the insulating layer 118. According to some embodiments, the contact plug (not shown in FIG. 1) has a first doping concentration, the two n-type heavily doped parts 120 have a second doping concentration, and the second doping concentration is higher than the first doping concentration.

As an AND flash memory device, in the semiconductor structure 100, a plurality of memory cells can be defined at cross points of the conductive stripes 104 and the channel layers 116. According to some embodiments, the conductive stripes 104 may be word lines, and for each of the active pillars 110, one of the two n-type heavily doped portions 112 is electrically connected to a bit line, and the other one is electrically connected to a source line. In the semiconductor structure 100, the active pillars 110 are arranged in an alternative manner. Correspondingly, pairs of bit lines, such as bit lines BL11 and BL12 as well as BL21 and BL22, and pairs of source lines, such as source lines SL11 and SL12 as well as SL21 and SL22, are provided. However, it can be appreciated that other types of arrangements can be applied for the active pillars 110 and the corresponding bit lines and source lines.

The semiconductor structure 100 further comprises an insulating material 124. The insulating material 124 is located in remaining spaces of the trenches 108 between the active pillars 110. The insulating material 124 is a silicon glass comprising an element which is applicable as a n-type dopant. For example, the silicon glass may be phosphorus silicon glass (PSG) or arsenic silicon glass (ASG).

A method for forming a semiconductor structure according to embodiments comprises following steps. First, an initial structure is provided. The initial structure comprises a plurality of stacks separated from each other by a plurality of trenches. A plurality of semi-manufactured active pillars are formed in the trenches. The semi-manufactured active pillars are separated from each other in each of the trenches. An insulating material is filled into remaining spaces of the trenches between the semi-manufactured active pillars. The insulating material is a silicon glass comprising an element which is applicable as a n-type dopant. Thereafter, n-type heavily doped portions are formed between the semi-manufactured active pillars and the insulating material by conducting a thermal process that drives the element which is applicable as a n-type dopant into the semi-manufactured active pillars.

Various stages of a semiconductor structure during such a method are illustrated in FIGS. 2A-2B to FIGS. 15A-15B, wherein the figures indicated by "A" and indicated by "B" show perspective views and corresponding cross-sectional views along the line C-C" in the figures indicated by "A", respectively. For clarity, only one stack and portions of two adjacent trenches are shown. The semiconductor structure is illustrated as a 3D AND flash memory device. However, it can be appreciated that embodiments of the disclosure is not limited thereto.

Figure 2A:
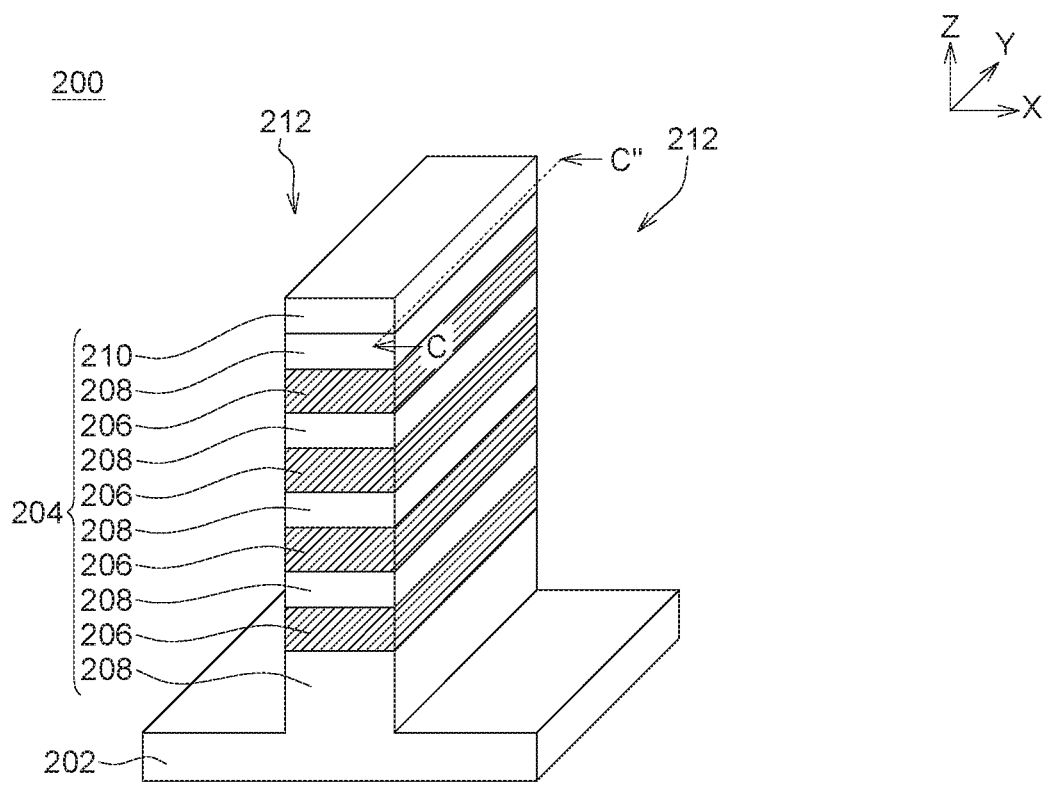
FIGS. 2A-2B to FIGS. 15A-15B show various stages of a semiconductor structure during an exemplary method for forming the semiconductor structure according to embodiments.
Figure 2B:
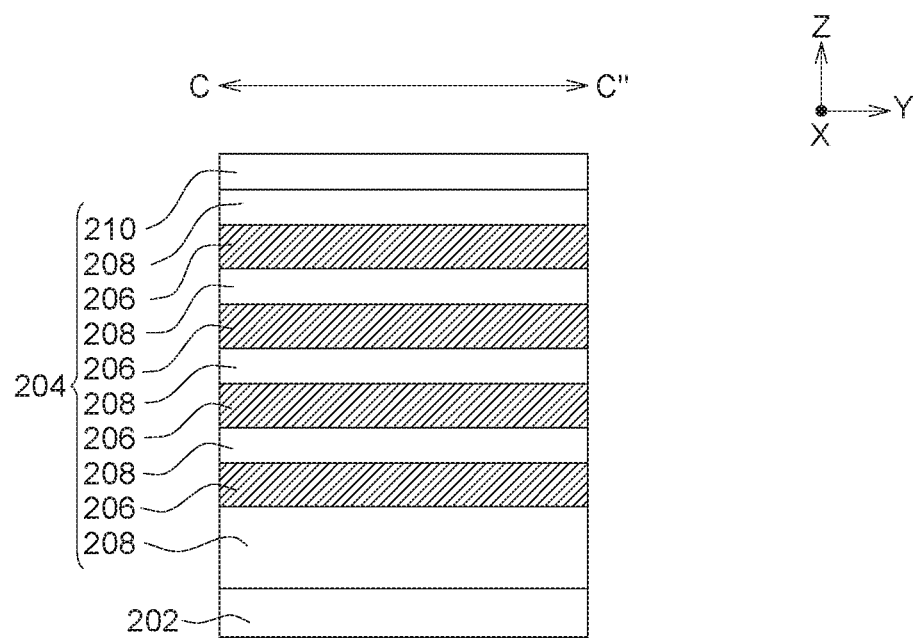

Referring to FIGS. 2A-2B, an initial structure 200 is provided. The initial structure 200 comprises a substrate 202. The initial structure 200 further comprises a plurality of stacks 204, which may be formed on the substrate 202. Each of the stacks 204 may comprise conductive stripes 206 and insulating stripes 208, which are stack alternately. The conductive stripes 206 may be formed of doped polysilicon or any other suitable material. The insulating stripes 208 may be formed of silicon oxide. In some embodiments, each of the stacks 204 further comprise a stress compensation layer 210 above the conductive stripes 206 and the insulating stripes 208. The stress compensation layer 210 compensates the tensile stress, and prevents the high aspect ratio stack 204 from collapse or bending. The stress compensation layer 210 may be formed of silicon nitride. The stacks 204 are separated from each other by a plurality of trenches 212.

Figure 3A:
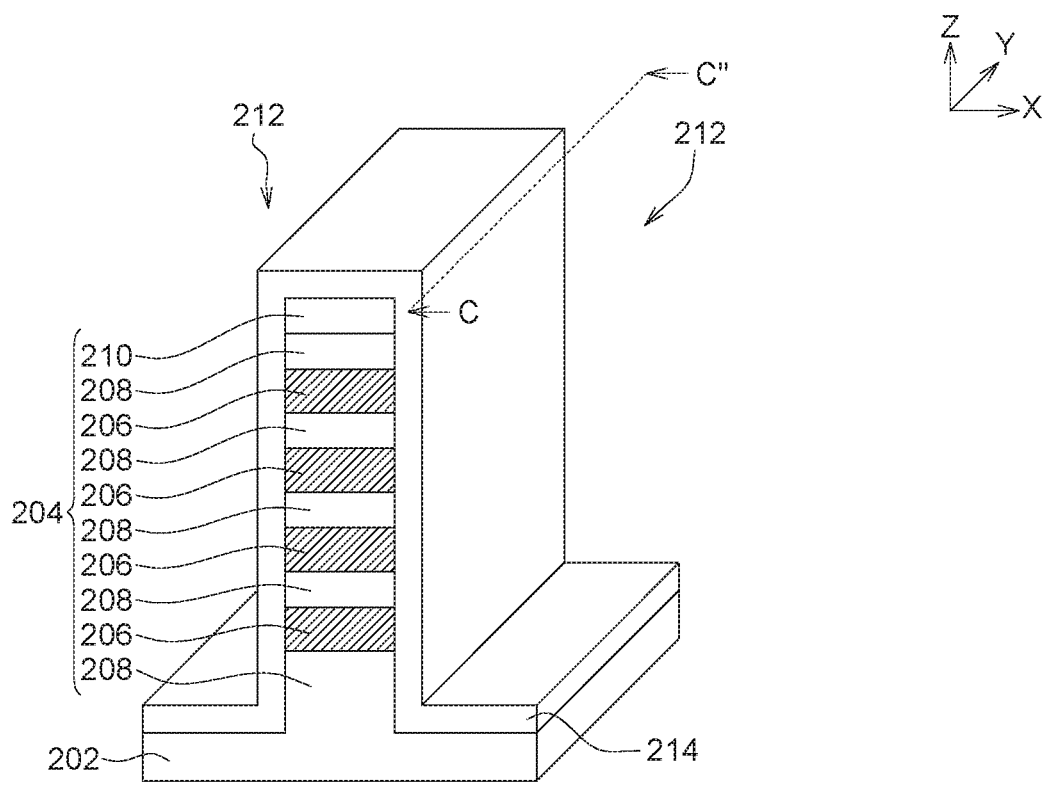
Figure 3B:
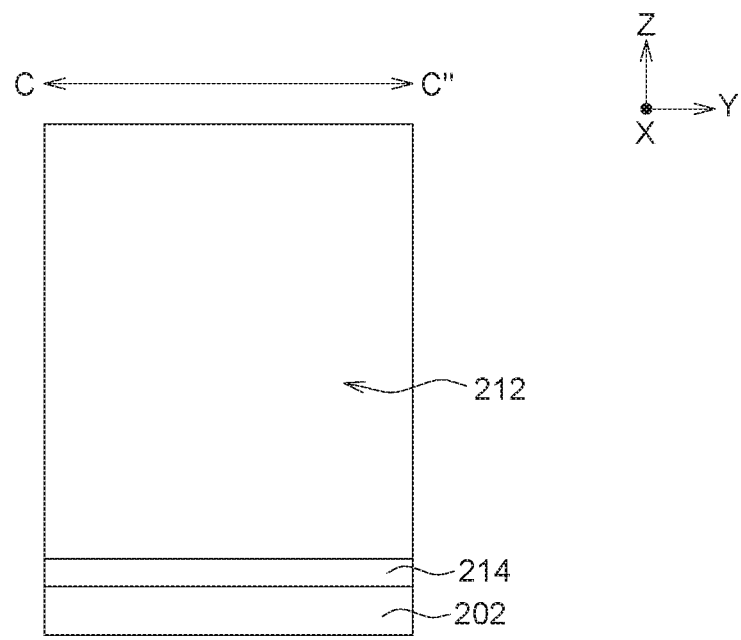

Referring to FIGS. 3A-3B, an initial memory layer 214 is conformally formed on the initial structure 200. The initial memory layer 214 may be a BE-SONOS (bandgap engineered silicon-oxide-nitride-oxide-silicon) layer, an ONONO (oxide-nitiride-oxide-nitiride-oxide) layer, or any other suitable layer.

Figure 4A:
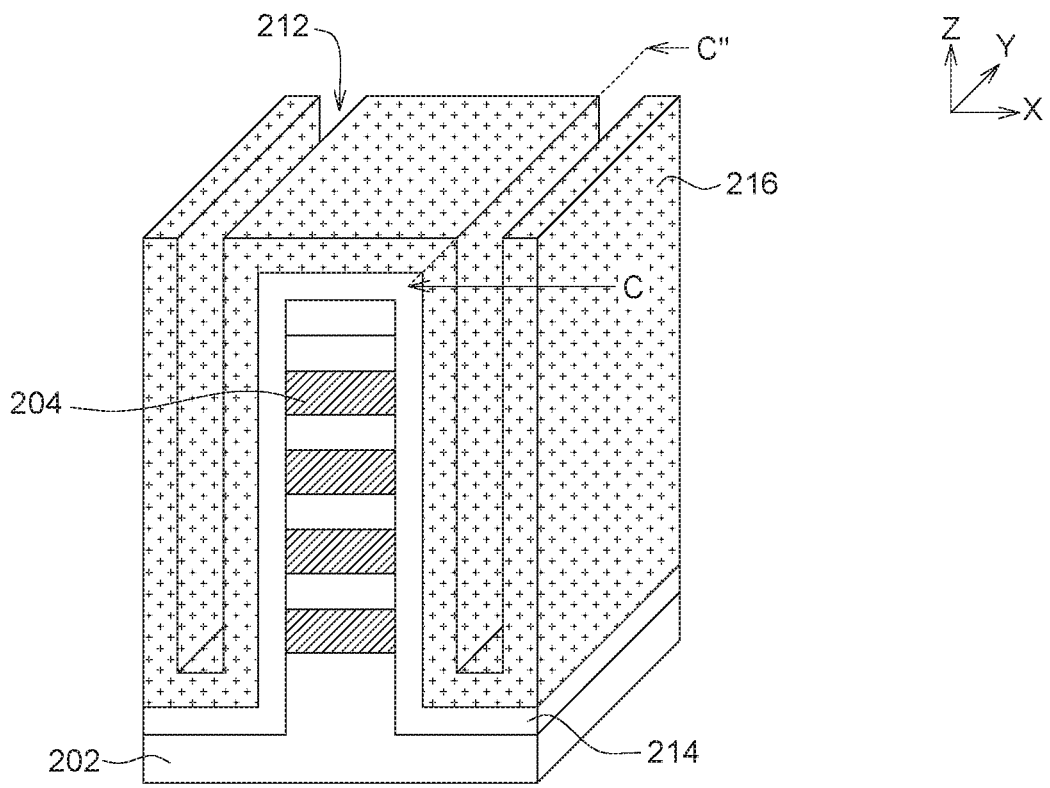
Figure 4B:
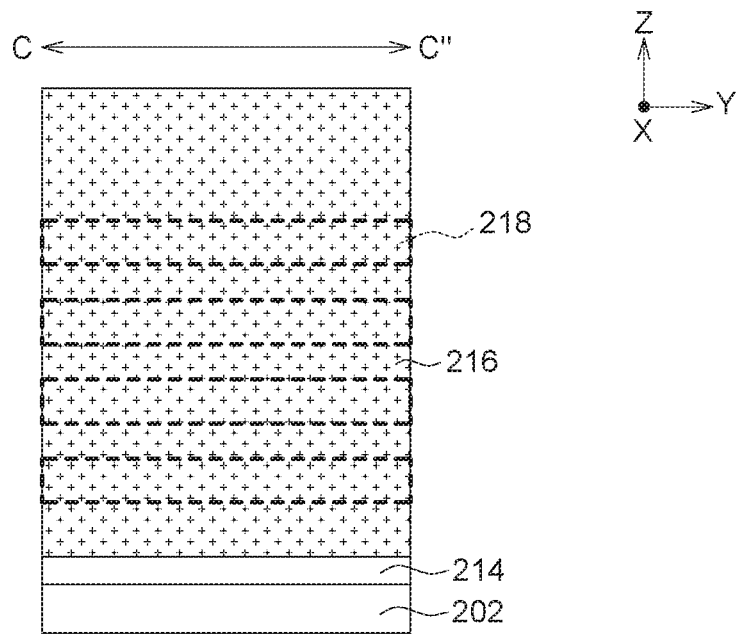

Referring to FIGS. 4A-4B, an initial channel layer 216 is conformally formed on the initial memory layer 214. The initial channel layer 216 may be formed of polysilicon. The initial channel layer 216 comprises a plurality of gate control regions 218 corresponding to the conductive stripes 206, as shown in FIG. 4B.

Figure 5A:
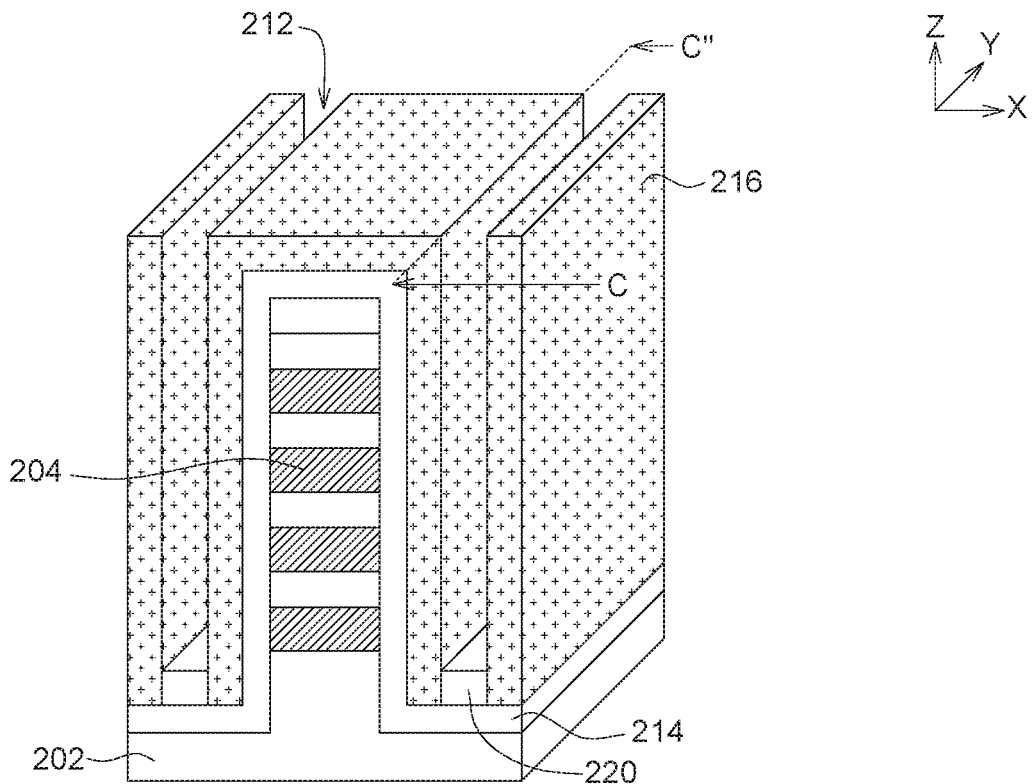
Figure 5B:
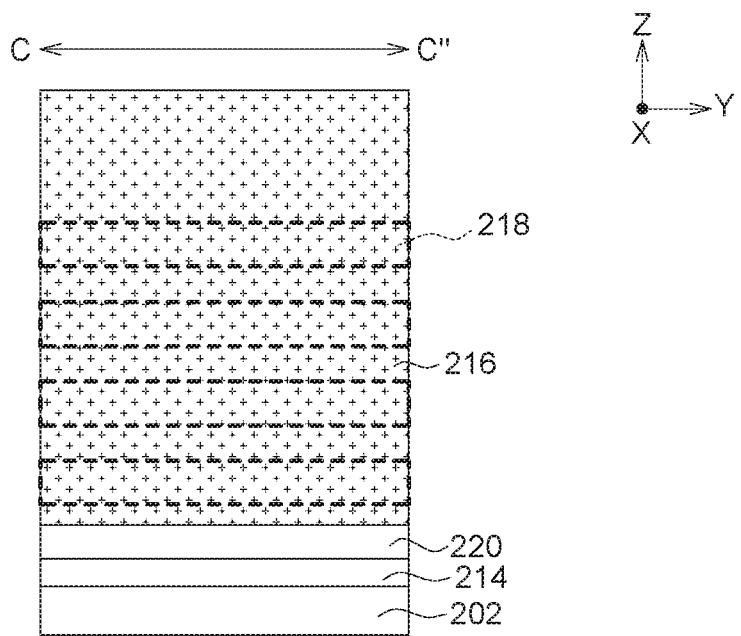

Referring to FIGS. 5A-5B, optionally, portions of the initial channel layer 216 that are located on bottoms of the trenches 212 may be implanted with a p-type dopant.

Thereby, p-type doped regions 220 are formed. This step ensures that the bottom portions of the channels being p-type doped, and thereby the leakage path can be reduced. The p-type doped regions 220 may be further cut at a following stage (such as the stage illustrated with reference to FIGS. 12A-12B), and form said p-type doped region of each active pillar 110 disposed under the insulating layer 118 with reference to FIG. 1.

Figure 6A:
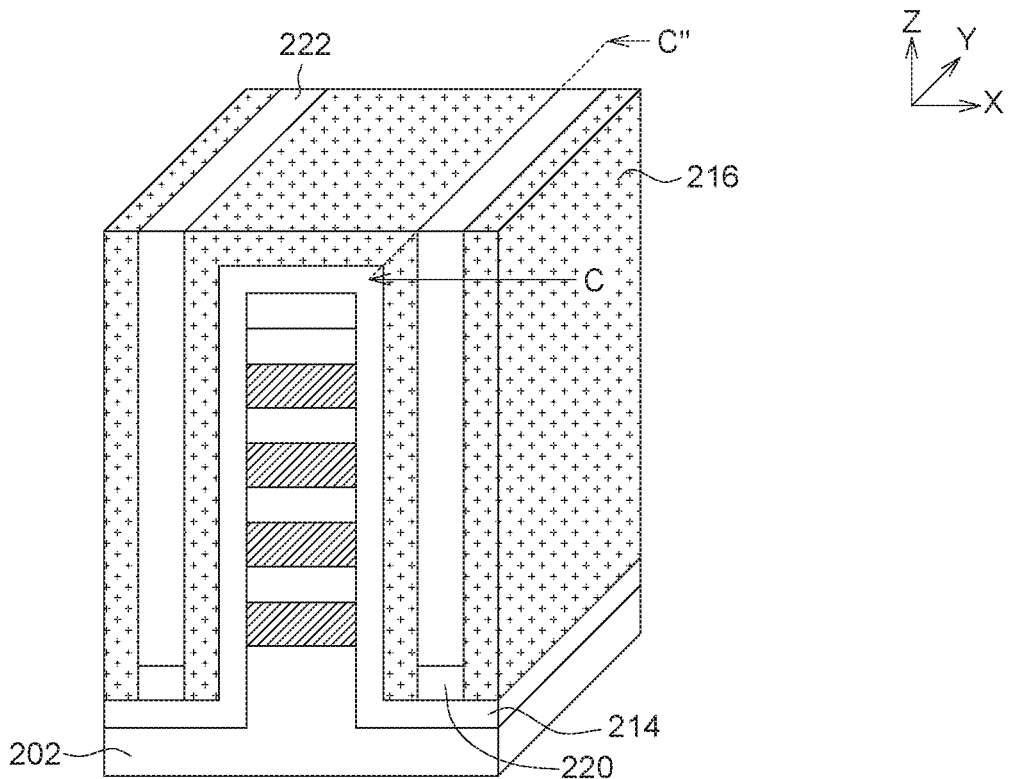
Figure 6B:
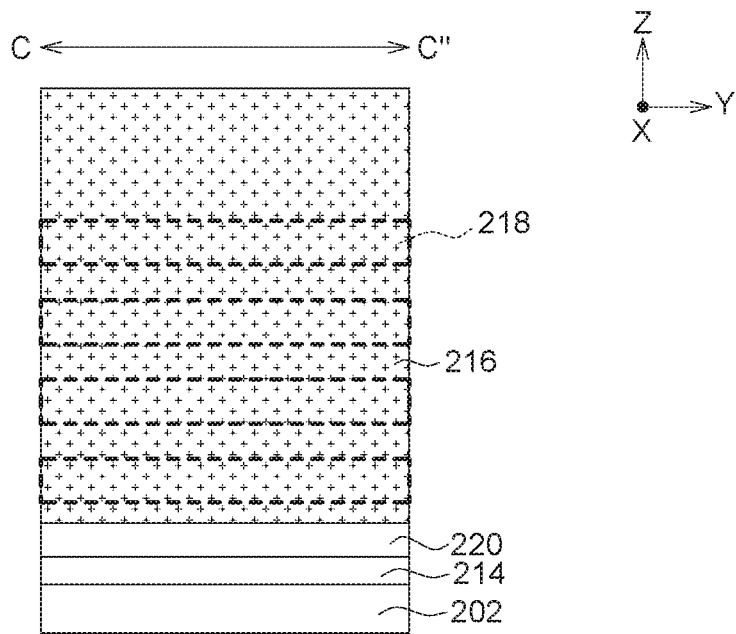
Figure 7A:
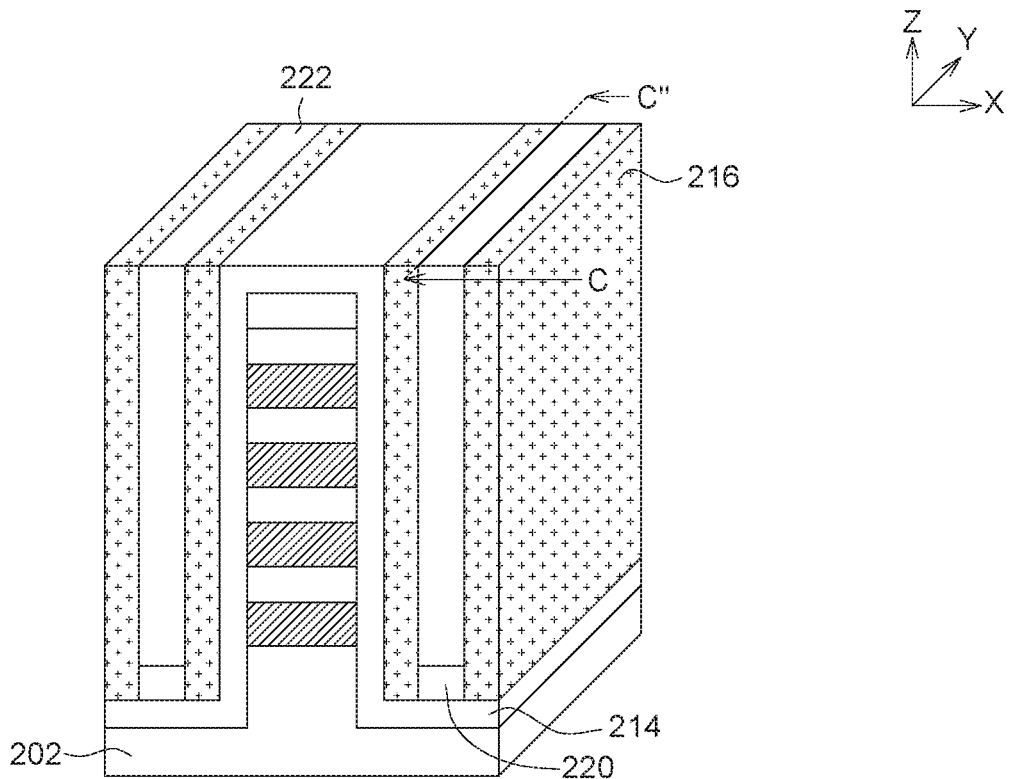
Figure 7B:
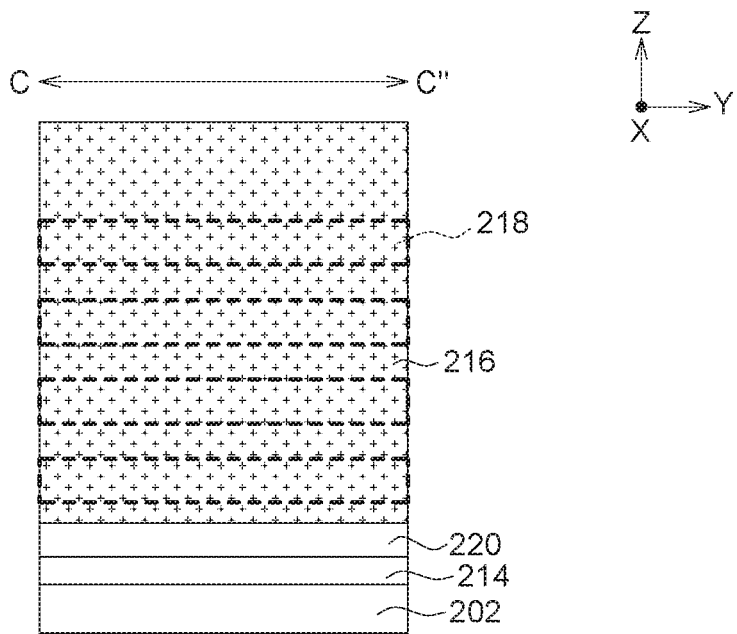

Referring to FIGS. 6A-6B, a plurality of insulating layers 222 are formed in remaining spaces of the trenches, respectively. The insulating layers 222 may be formed of oxide. Then, a planarization process may be conducted, as shown in FIGS. 7A-7B. The planarization process stops on portions of the initial memory layer 214 which are located on the stacks 204. The planarization process may be a chemical mechanical planarization (CMP) process, an etching back process, or any other suitable planarization process.

Figure 8A:
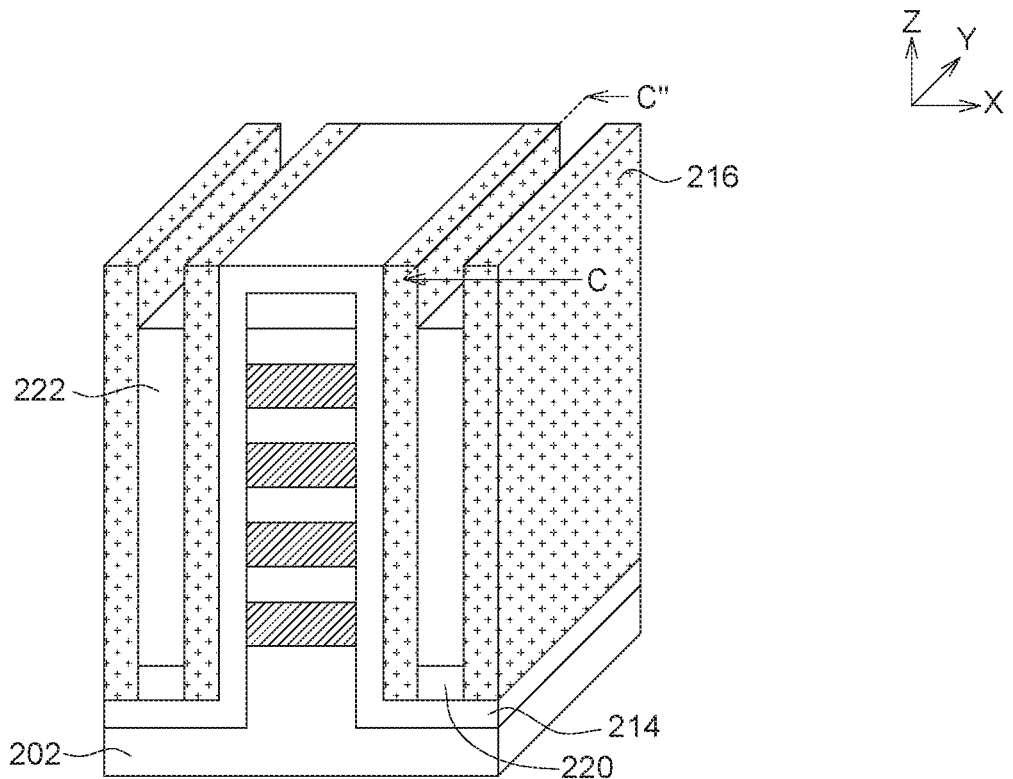
Figure 8B:
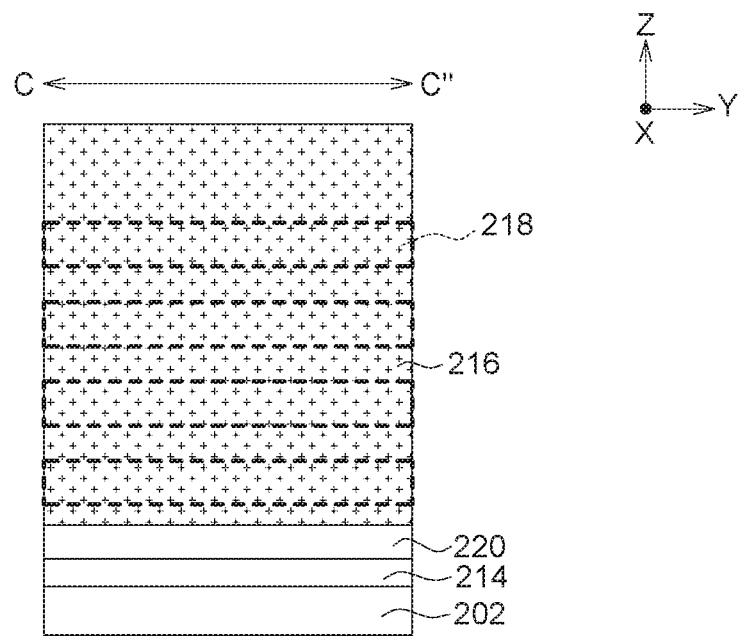
Figure 9A:
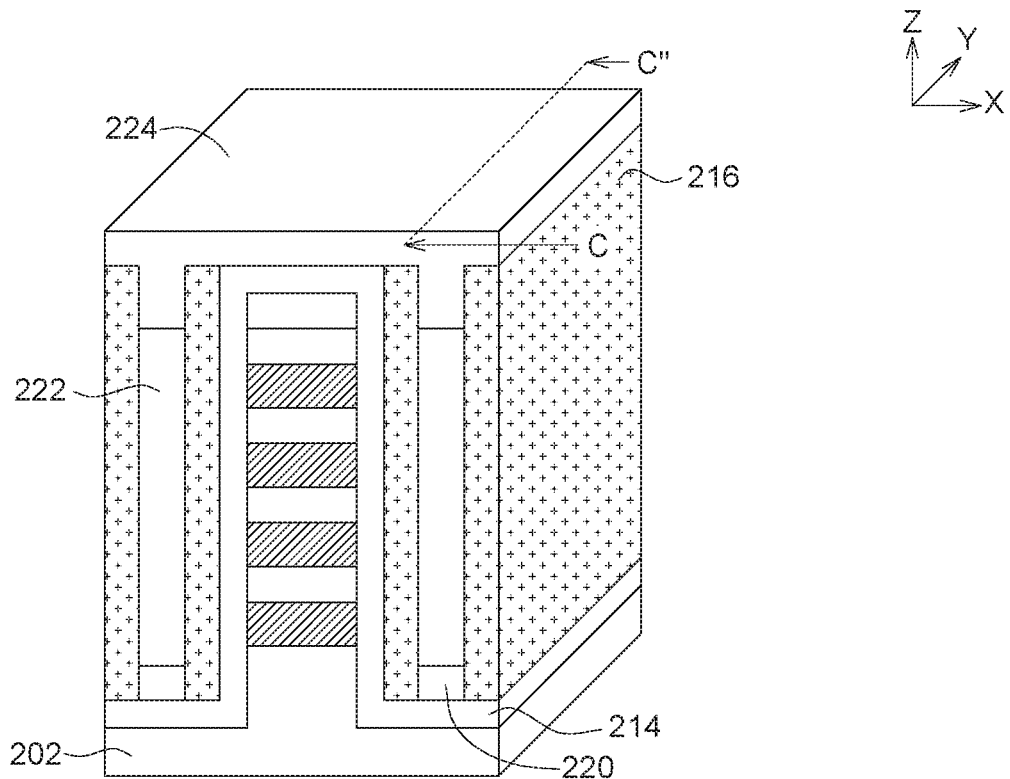
Figure 9B:
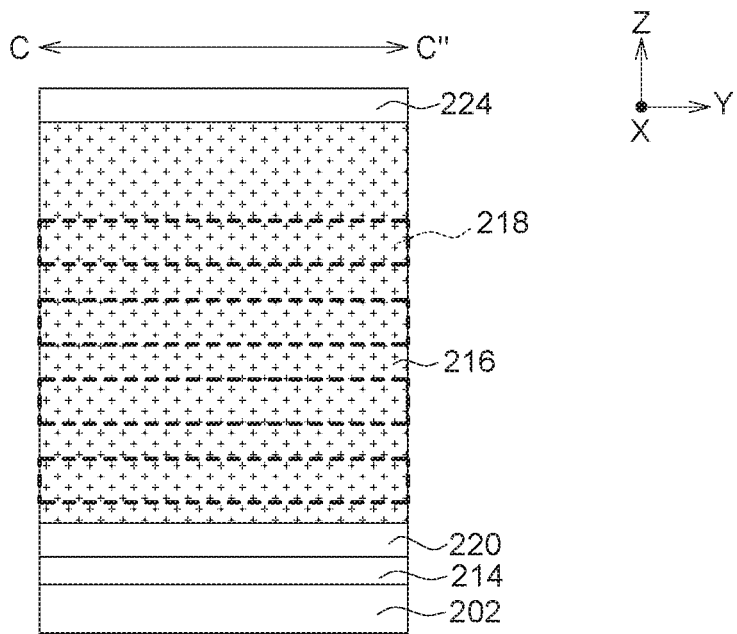
Figure 10A:
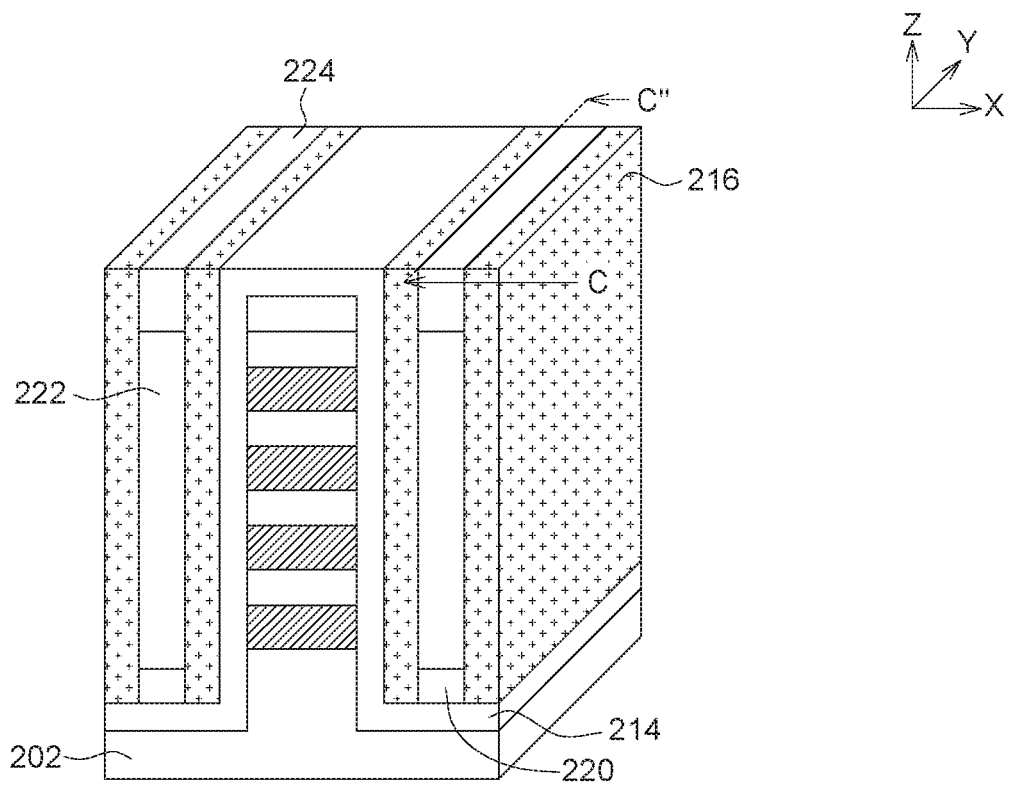
Figure 10B:
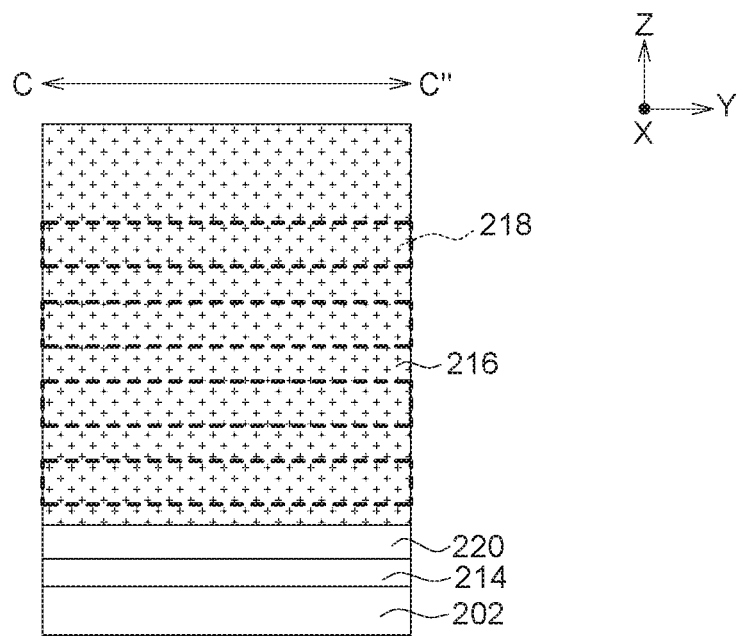
Figure 11A:
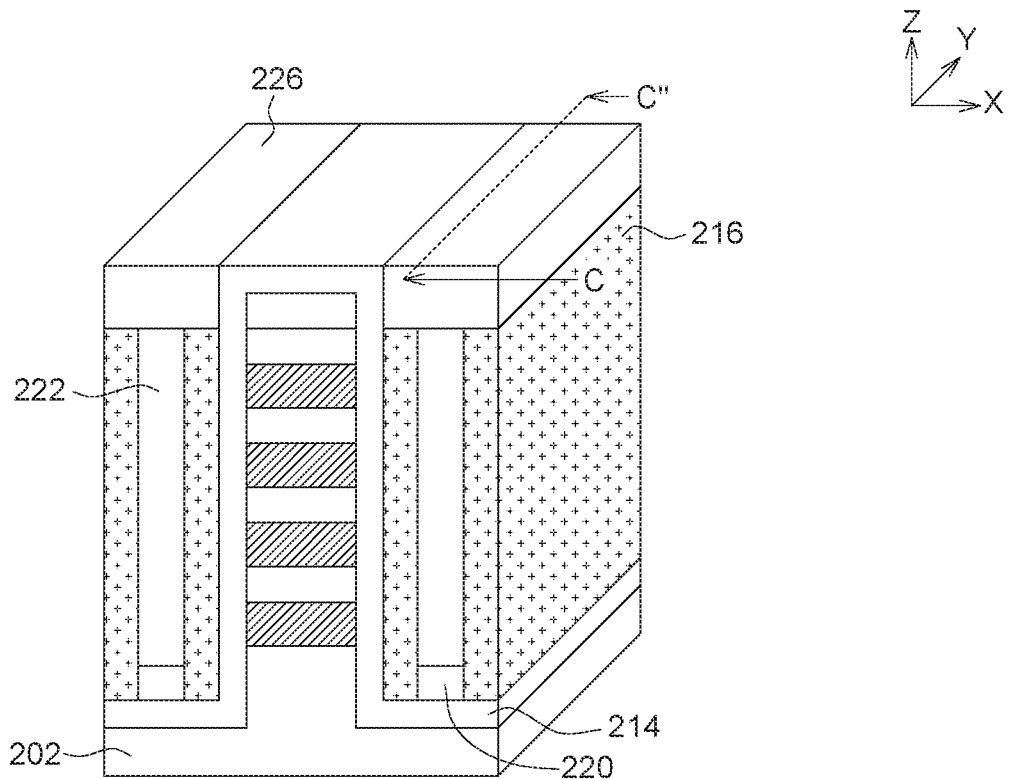
Figure 11B:
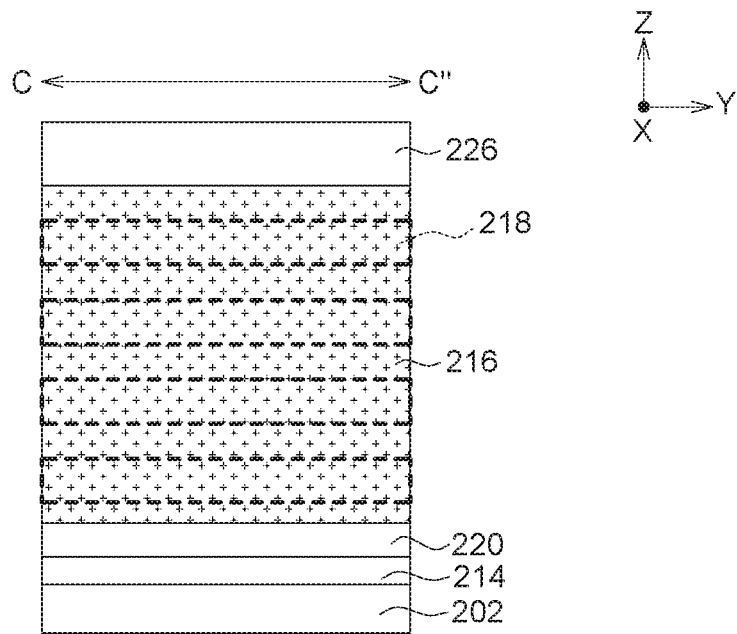

Referring to FIGS. 8A-8B, top portions of the insulating layers 222 are removed. Then, referring to FIGS. 9A-9B, an intrinsic material 224, such as polysilicon, is filled into the spaces produced by removing the top portions of the insulating layers 222. As shown in FIGS. 9A-9B, the intrinsic material 224 may form a layer on the semiconductor structure. As such, a planarization process may be conducted, as shown in FIGS. 10A-10B. The planarization process also stops on the portions of the initial memory layer 214 which are located on the stacks 204. Referring to FIGS. 11A-11B, a implantation process is conducted with a p-type dopant. In particular, the intrinsic material 224, (the polysilicon) is implanted with the p-type dopant. The p-type dopant may, but not limited to, be boron (B). According to some embodiments, the doping concentration of implanting the polysilicon with the p-type dopant may be at an order of magnitude of $10^{15}$ cm$^{-3}$. Contact plugs 226 of semi-manufactured active pillars are formed thereby. The contact plugs 226 provide enough thickness of the silicon portions for landing of contacts. The implantation process with the p-type dopant can provide p-type doped contact plugs 226, particularly p-type heavily-doped contact plugs 226, which can reduce plug resistance and prevent a punch through from happening.

Figure 12A:
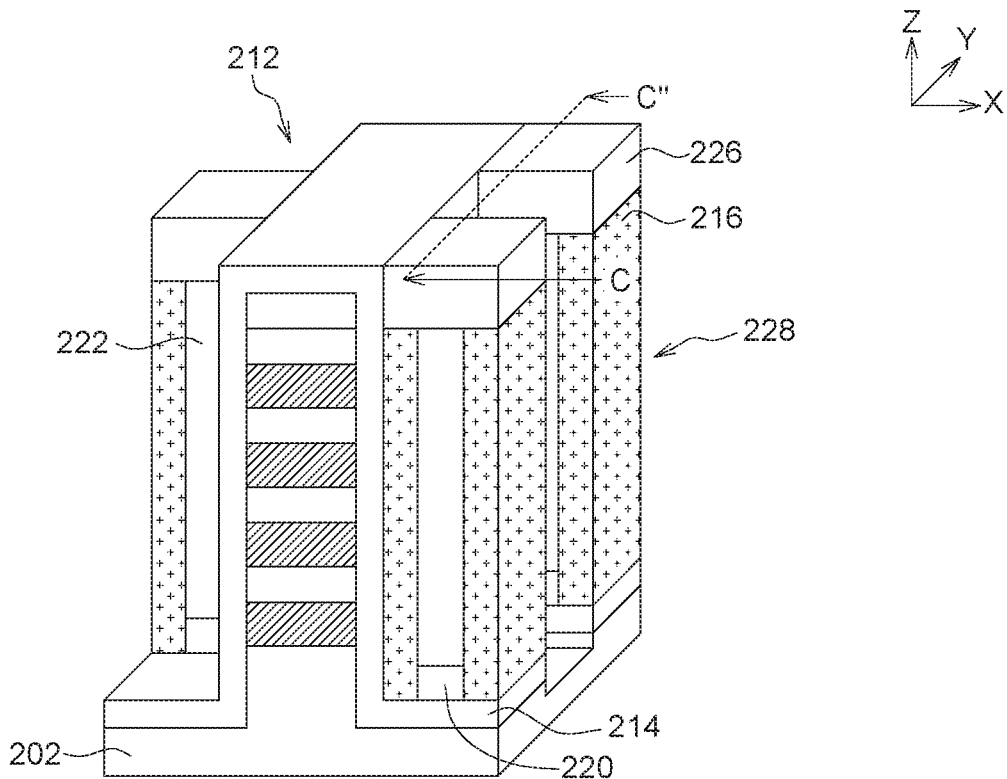
Figure 12B:
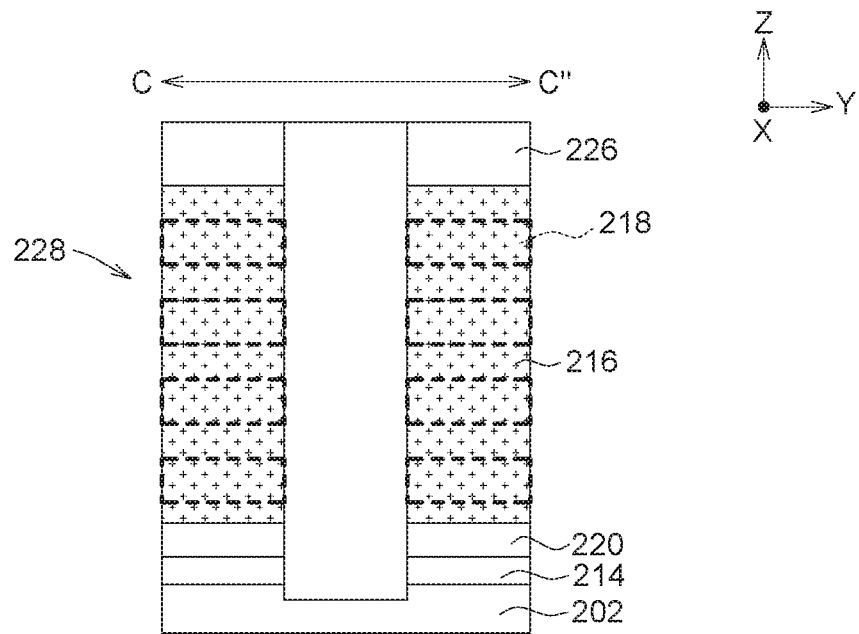

Then, referring to FIGS. 12A-12B, at least portions of the initial channel layer 216 and the insulating layers 222 that are in each of the trenches are cut. As such, a plurality of semi-manufactured active pillars 228 are formed in the trenches 212. The semi-manufactured active pillars 228 are separated from each other in each of the trenches 212. The semi-manufactured active pillars 228 may, but not limited to, be arranged in an alternative manner. The openings formed by the cutting step may extend into the substrate 202, as shown in FIG. 12B. Alternatively, the openings may stop on the initial memory layer 214 and not extend to the substrate 202.

Figure 13A:
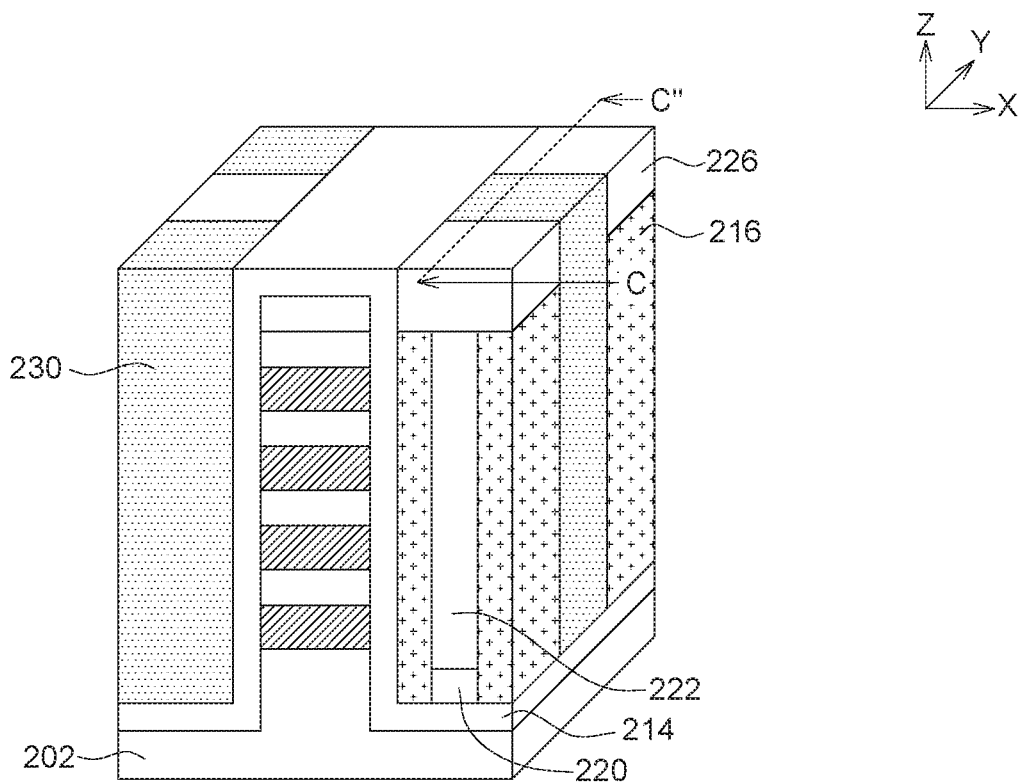
Figure 13B:
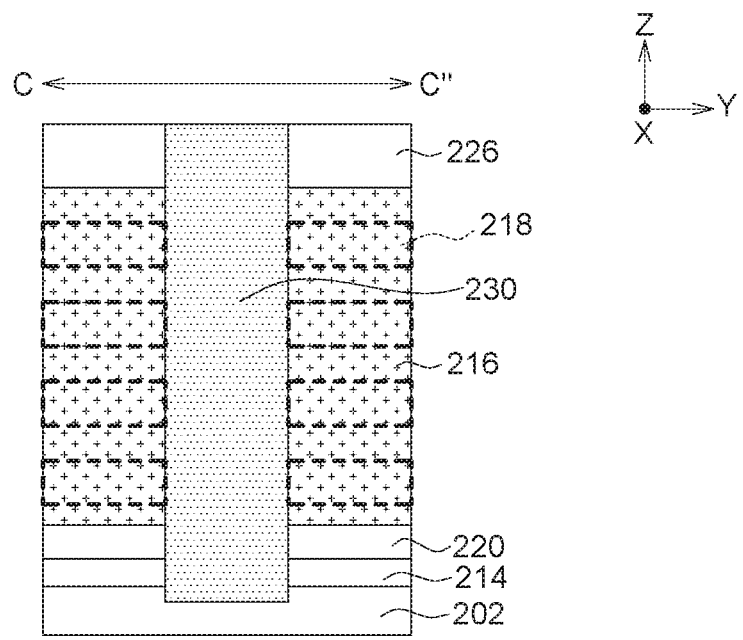

Referring to FIGS. 13A-13B, an insulating material 230 is filled into remaining spaces of the trenches 212 between the semi-manufactured active pillars 228 (i.e., the openings formed in the previous stage). The insulating material is a silicon glass comprising an element which is applicable as a n-type dopant. For example, the silicon glass may be phosphorus silicon glass (PSG) or arsenic silicon glass (ASG). In other words, the element which is applicable as a n-type dopant in the silicon glass is phosphorous (P) or arsenic (As). In some embodiments, PSG is preferred since phosphorous in PSG has a higher thermal diffusion speed than arsenic in ASG. According to some embodiments, the doping concentration of implanting the polysilicon with the p-type dopant at the stage illustrated with respect to FIGS. 8A-8B is lower than a doping concentration of the element which is applicable as a n-type dopant driven from the insulating material 230 into the semi-manufactured active pillars 228 during a following thermal process, such that portions of the cut initial channel layer 216 and portions of the contact plugs 226 that are close to the insulating material 230 form the n-type heavily doped portions 232 (shown in FIGS. 14A-14B) after the thermal process. For example, in the cases that the doping concentration of implanting the polysilicon with the p-type dopant is at an order of magnitude of $10^{15}$ cm$^{-3}$, the doping concentration of the element which is applicable as a n-type dopant driven from the insulating material into the semi-manufactured active pillars may be equal to or higher than $5\times10^{20}$ cm$^{-3}$. Correspondingly, the concentration of the element which is applicable as a n-type dopant in the insulating material 230 is equal to or higher than $5\times10^{20}$ cm$^{-3}$.

Figure 14A:
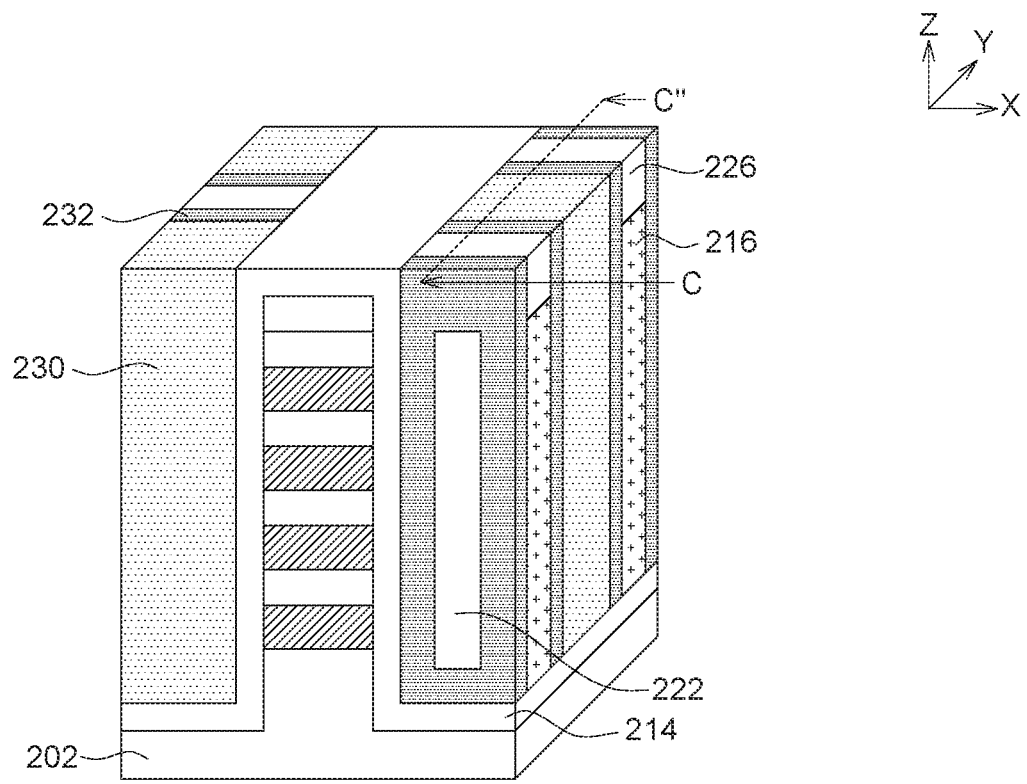
Figure 14B:
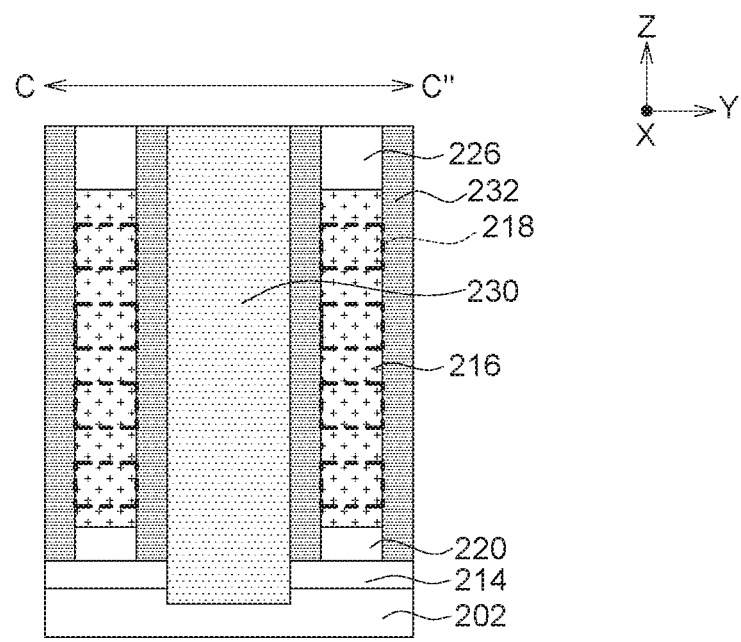

Referring to FIGS. 14A-14B, n-type heavily doped portions 232 are formed between the semi-manufactured active pillars 228 and the insulating material 230 by conducting a thermal process that drives the element which is applicable as a n-type dopant into the semi-manufactured active pillars 228. As such, the active pillars as illustrated with reference to FIG. 1 can be formed. The element which is applicable as a n-type dopant can be driven into the undoped or doped polysilicon portions of the semi-manufactured active pillars 228 by a thermal process because it has the tendency to stay in the polysilicon than in the silicon glass. According to some embodiments, the thermal process may be conducted at 950° C. for 30 min. It can be appreciated that a higher temperature and/or a longer heating time can be used. As described above, in the cases that the doping concentration of implanting the polysilicon with the p-type dopant is lower than the doping concentration of the element which is applicable as a n-type dopant driven from the insulating material into the semi-manufactured active pillars, the portions of the cut initial channel layer 216 and portions of the contact plugs 226 that are close to the insulating material form the n-type heavily doped portions 232 after the thermal process, as shown in FIGS. 14A-14B.

Figure 15A:
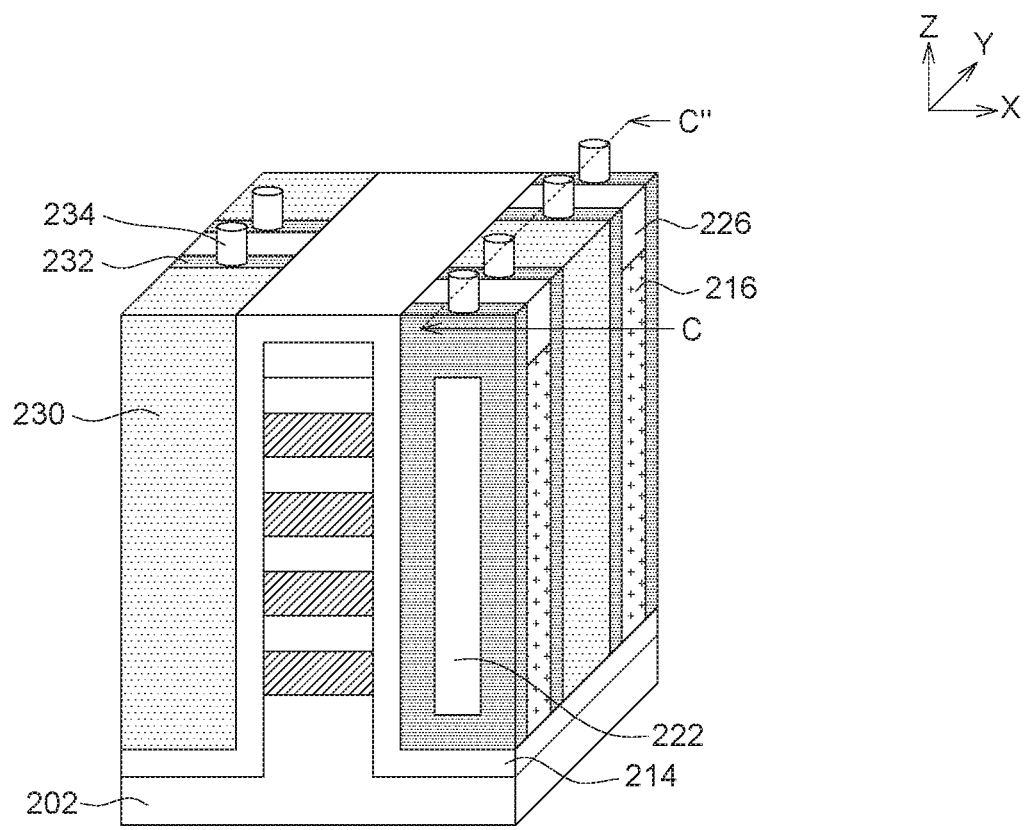
Figure 15B:
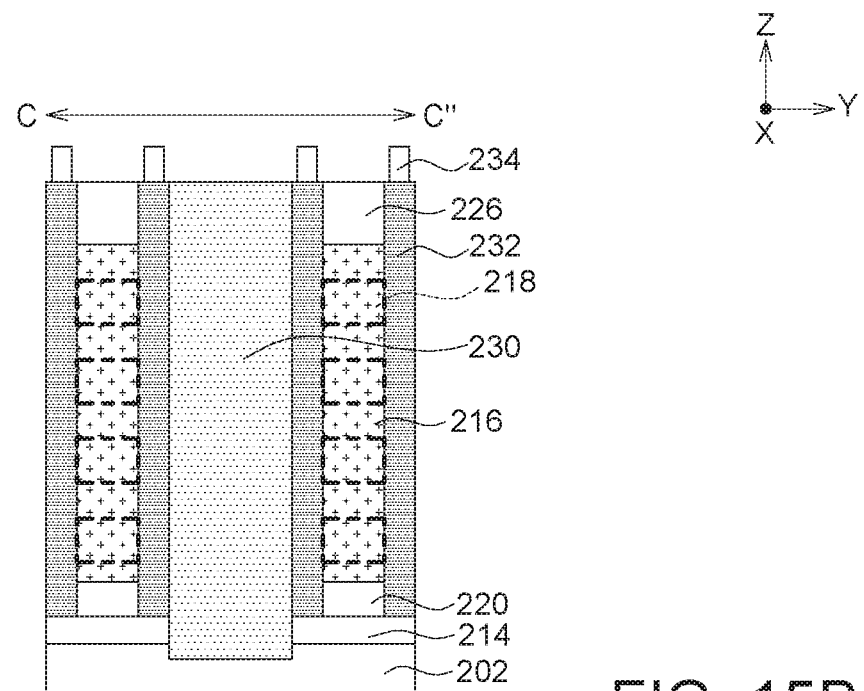

Referring to FIGS. 15A-15B, contacts 234 may be formed on the n-type heavily doped portions 232, respectively. The two n-type heavily doped portions 232 of each of the active pillars can be functioned as a source region and a drain region, respectively, and the contacts 234 thereon can be used to provide electrical connection to the corresponding source line and bit line that will be arranged over the structure (as shown in FIG. 1). It is understood that some further processes, such as the process for forming the bit lines and source lines, can be conducted after the stage shown in FIGS. 15A-15B.

According to the disclosure, the dopant for the implantation process of a n-type heavily doped portion extending in a substantially vertical direction is provided from a lateral implanting source, i.e. a silicon glass comprising an element which is applicable as a n-type dopant. Thereby, an uniform doping concentration in the vertical direction can be obtained. The silicon glass can be used to replace an insulating material conventionally used in semiconductor structures for isolation between vertically extending components. As such, the processes as described above can be easily conducted in a self-align and controllable manner without much additional cost. In addition, the processes are compatible with the general manufacturing processes of semiconductor devices.

The exemplarily 3D AND flash memory device and exemplarily method for forming the same can be used in various applications, particularly those in which doped portions with uniform doping concentration in a vertical direction are strongly needed. An example of which is the field of AI memory application. Further, while the forgoing embodiments are exemplarily directed to 3D memory device, it can be appreciated that the concept of the disclosure can be applied to other semiconductor structures in which a uniform n-type heavily doped portion extending in a substantially vertical direction is desired.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
   a plurality of stacks separated from each other by a plurality of trenches;
   a plurality of active pillars disposed in the trenches and separated from each other in each of the trenches, wherein each of the active pillars comprises two n-type heavily doped portions at two sides of the each of the active pillars, each of the two n-type heavily doped portions extends in a substantially vertical direction, and each of the two n-type heavily doped portions connects corresponding two stacks of the plurality of stacks; and
   an insulating material located in remaining spaces of the trenches between the active pillars, wherein the insulating material is a silicon glass comprising an element which is applicable as a n-type dopant.

2. The semiconductor structure according to claim 1, wherein each of the stacks comprises alternately stacked conductive stripes and insulating stripes;
   wherein each of the active pillars further comprises:
   two memory layers disposed on sidewalls of the corresponding two stacks, respectively;
   two channel layers disposed between the two memory layers, wherein the two channel layers are disposed on sidewalls of the two memory layers, respectively; and
   an insulating layer disposed between the two channel layers;
   wherein the two channel layers and the insulating layer are located between the two n-type heavily doped portions; and
   wherein a plurality of memory cells are defined at cross points of the conductive stripes and the channel layers.

3. The semiconductor structure according to claim 2, wherein each of the active pillars further comprises:
   a contact plug disposed on the insulating layer; and
   a p-type doped region disposed under the insulating layer.

4. The semiconductor structure according to claim 3, wherein each of the n-type heavily doped portions comprises:
   two n-type heavily doped parts disposed close to the corresponding two stacks, respectively; and
   an insulating part disposed between the two n-type heavily doped parts.

5. The semiconductor structure according to claim 4, wherein the contact plug is p-type implanted and has a first doping concentration, the two n-type heavily doped parts have a second doping concentration, and the second doping concentration is higher than the first doping concentration.

6. The semiconductor structure according to claim 2, wherein the conductive stripes are word lines, and wherein for each of the active pillars, one of the two n-type heavily doped portions is electrically connected to a bit line, and the other one is electrically connected to a source line.

7. The semiconductor structure according to claim 1, wherein the silicon glass is phosphorus silicon glass (PSG) or arsenic silicon glass (ASG).

* * * * *